(12) United States Patent
Cohen et al.

(10) Patent No.: US 7,603,614 B2
(45) Date of Patent: Oct. 13, 2009

(54) METHOD AND SYSTEM FOR INDICATING AN EXECUTABLE AS TROJAN HORSE

(75) Inventors: Oded Cohen, Tivon (IL); Yanki Margalit, Ramat-Gan (IL); Dany Margalit, Ramat-Gan (IL)

(73) Assignee: Aladdin Knowledge Systems Ltd., Petach Tivka (IL)

( * ) Notice: Subject to any disclaimer, the term of this patent is extended or adjusted under 35 U.S.C. 154(b) by 0 days.

(21) Appl. No.: 10/436,047

(22) Filed: May 13, 2003

(65) Prior Publication Data

US 2007/0226603 A1 Sep. 27, 2007

(51) Int. Cl.
*G11C 29/00* (2006.01)
(52) U.S. Cl. .................. 714/805; 235/380; 506/28; 726/23; 726/24
(58) Field of Classification Search .................. 714/805
See application file for complete search history.

(56) References Cited

U.S. PATENT DOCUMENTS

| | | | |
|---|---|---|---|
| 5,359,659 A * | 10/1994 | Rosenthal | 726/24 |
| 7,058,978 B2 * | 6/2006 | Feuerstein et al. | 726/26 |
| 7,085,936 B1 * | 8/2006 | Moran | 726/5 |
| 2002/0083341 A1 * | 6/2002 | Feuerstein et al. | 713/201 |
| 2005/0223239 A1 * | 10/2005 | Dotan | 713/188 |

FOREIGN PATENT DOCUMENTS

| EP | 0656587 A1 | 6/1995 |
|---|---|---|
| EP | 1202596 A2 | 5/2002 |

* cited by examiner

*Primary Examiner*—M. Mujtaba K Chaudry
*Assistant Examiner*—Enam Ahmed
(74) *Attorney, Agent, or Firm*—Mark M. Friedman

(57) ABSTRACT

A method and system for indicating an executable as Trojan Horse, based on the CRC values of the routines of an executable. The method comprising a preliminary stage in which the CRC values of the routines of known Trojan Horses are gathered in a database, and a stage in which indicating an executable as Trojan Horse is carried out by the correspondence of the CRC values of the routines of said executable to the CRC values of the known Trojan Horses, as gathered in said database. The system comprising means for calculating the CRC values of routines; means for identifying the borders of the routines of an executable; a database system, for storing the CRC values of routines of known Trojan Horses; and means for determining the correspondence between two groups of CRC values, thereby enabling detection of the correspondence of an executable to at least one known Trojan Horse.

19 Claims, 5 Drawing Sheets

US 7,603,614 B2

METHOD AND SYSTEM FOR INDICATING AN EXECUTABLE AS TROJAN HORSE

FIELD OF THE INVENTION

The present invention relates to the field of malicious code detection. More particularly, the invention relates to a method and system for indicating an executable as Trojan Horse.

BACKGROUND OF THE INVENTION

The detection of viruses and other forms of malicious objects in a file can be carried out in two major ways; virus signature and code analysis, but actually there are many additional methods known in the art for this purpose.

A "Virus signature" is a unique bit pattern that a virus leaves on the infected code. Like a fingerprint, it can be used for detecting and identifying specific viruses. The major drawback of the "signature analysis" is that a virus should firstly be detected and isolated (e.g. by comparing the infected code with the original code) and only then can the signature characteristics be distributed by the anti-virus company among its users.

In order to overcome the signature analysis, the virus "author" may masquerade the signature by adding non-effective machine language commands between the effective commands, thereby creating an unknown signature. Moreover, the added commands can be selected randomly. This way the virus can strike before being detected and consequently cause a great deal of damage.

Another way of detecting malicious code within an executable is by analyzing its operation. Since the malicious code is usually added at the end of the executable and the executable is changed such that the fist command to be executed will be the added code, indicating such an operation pattern can be an indicator for malicious code. The major drawback of code analysis methods is that it is not a simple procedure and therefore a great deal of effort must be invested in order to achieve meaningful results.

A malicious executable which is not a result of an infection is actually a "legitimate" executable and therefore is very difficult to be classified as malicious. Such an executable is referred in the art as "Trojan Horse".

The term Trojan or Trojan Horse refers herein to a program in which malicious code is contained inside apparently harmless programming or data, in order to cause damage to the computer, such as ruining the file allocation table. The Trojan can either be a compiled code or a non-compiled code, e.g. a script.

Due to their nature, Trojan Horses are difficult to detect before striking. Moreover, since the malicious code of Trojans is embedded in a program during the design time, the form of the malicious code does not differ from the rest of the program. Contrary to Trojan Horses, viruses "infect" other programs, and therefore the structure of the added code has some characteristics that distinguish them from the rest of the program.

It is therefore an object of the present invention to provide a method and system for indicating an executable as Trojan Horses, whether the executable is a compiled code or non-compiled code.

Other objects and advantages of the invention will become apparent as the description proceeds.

SUMMARY OF THE INVENTION

A method and system for indicating an executable as Trojan Horse, based on the CRC values of the routines of an executable. The method comprising a preliminary stage in which the CRC values of the routines of known Trojan Horses are gathered in a database, and a stage in which indicating an executable as Trojan Horse is carried out by the correspondence of the CRC values of the routines of said executable to the CRC values of the known Trojan Horses, as gathered in said database. The system comprising means for calculating the CRC values of routines; means for identifying the borders of the routines of an executable; a database system, for storing the CRC values of routines of known Trojan Horses; and means for determining the correspondence between two groups of CRC values, thereby enabling detection of the correspondence of an executable to at least one known Trojan Horse.

BRIEF DESCRIPTION OF THE DRAWINGS

The present invention may be better understood in conjunction with the following figures:

FIG. 3a describes the preliminary stage of the method, in which a database of CRC values is constructed. FIG. 3b describes the detection of a Trojan Horse.

DETAILED DESCRIPTION OF PREFERRED EMBODIMENTS

Figure 1:
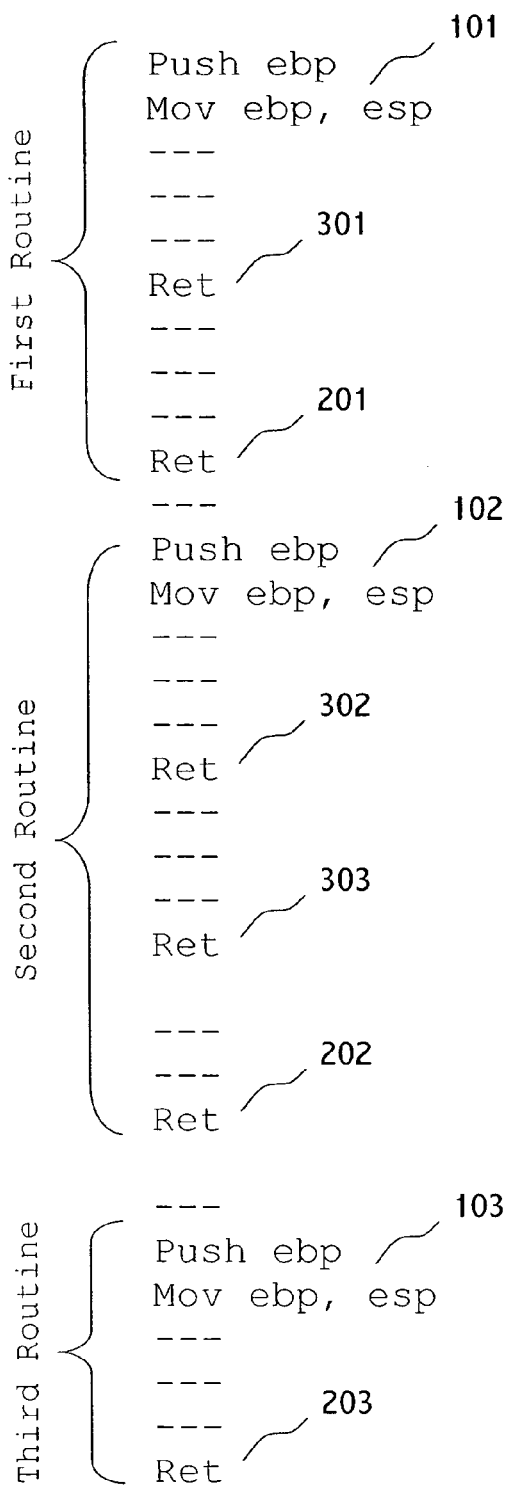
FIG. 1 schematically illustrates a typical structure of a compiled executable.

CRC, the acronym of Cyclic Redundancy Checking, is a method of testing data integrity. The mathematical model is made up of polynomials with binary coefficients. Typically it is used to test the integrity of data transferred through a communication channel. In a typical scheme, the CRC is computed to each data block transferred from a source to a destination, and the CRC bytes (i.e. the result of the CRC) are transferred with the corresponding data block. At the destination, the CRC is computed again from the received data block, and if the result corresponds to the received CRC bytes, then the data is considered to be transferred correctly.

There are a variety of standards for computing and handling CRC. The ITU-TS (CCITT) has a standard for a 16-bit polynomial. IBM's Synchronous Data Link Control and other protocols use CRC-16, another 16-bit polynomial. A 16-bit cyclic redundancy code detects especially typical communication errors, like single and double-bit errors. It actually ensures detection of 99.998% of all possible errors. This level of detection assurance is considered sufficient for data transmission blocks of 4 kilobytes or less. For larger transmissions, a 32-bit CRC is used. The Ethernet and token ring local area network protocols both used a 32-bit CRC. In Europe, CRC-4 is a multi-frame system of cyclic redundancy checking that is required for switches on E-1 lines.

A less complicated but less capable error detection method is the checksum method, which is commonly used by modem error-correcting protocols.

CRC methods are also used for virus detection. A common use of CRC is for detecting the infection of the boot sector of a computer. The Boot sector is one of the first codes to be executed when a computer boots. As a part of the boot procedure, a program which is stored in EPROM (i.e. non-volatile RAM) loads the boot sector into the memory, and executes it. At this stage, no antivirus facilities are yet executed, and therefore at this point the computer is extremely vulnerable.

The term "source code" refers in the art to a human-readable programming text. In order to be executed, a special program called "compiler" converts the source code to an "object code", which can be executed by the computer.

On the one hand, the object code has an advantage over the source code since it is almost impossible to further develop a program from the object code. On the other hand, the compilation stage requires time and consequently the development process becomes more expensive and less convenient to the programmer.

In order to spare the compilation time, another form of program has been developed, the "interpreter". An interpreter is a program executed from its source code, i.e. without compilation. The script languages VBScript, JavaScript and others, are examples for interpreted code.

The term "executable" refers herein to the form of the program which is ready to be executed, whether compiled or non-compiled code.

Computing the CRC of Routines in an Object Code

In computer art, the term routine (or subroutine or procedure) refers to a sequence of code that is intended to be called and used repeatedly during the executable of a program.

For example, a routine of a compiled code of Microsoft C starts with three hexadecimal bytes "55 8B EC", which are the binary code of the Assembler instructions "Push ebp; Mov ebp, esp". A routine ends with a Ret instruction, where its hexadecimal value is C3, CB, C2, or CA. Thus, according to one embodiment of the present invention, the code of the executable file is scanned in order to find the bytes "55 8B EC" followed by the bytes "C3" (or "CB", or "C2", or "CA"). After detecting the "borders" of a routine, its CRC value is calculated, and used for detecting maliciousness, as will be explained herein.

FIG. 1 schematically illustrates a typical structure of a compiled executable. The figures illustrates three routines, each of which starts with a "Push ebp; Mov ebp, esp" instructions (marked as 101, 102, and 103), and ends with a "Ret" assembler instruction (marked as 201, 202, and 203). The example is in Assembler. It should be noted that a routine may comprise multiple "Ret" instructions, however the last "Ret" instruction which appears just before the next "Push ebp; Mov ebp, esp" occurrence terminates a routine (marked as 201, 202 and 203). The other "Ret" instruction, 301, 302 and 303, refers to "Ret" instructions within a routine.

It should be noted that since instructions that refer to absolute addresses or to addresses outside the routine (e.g. "CALL <Address>", "JMP FAR <Address>") comprise an address in the memory, which may be different on each execution of the program, certainly for different Trojans. Therefore, when calculating the CRC value of a routine, this point should be taken into consideration, e.g. by replacing the bytes of an absolute address by zeros, before calculating the CRC value.

Typically, a "hacker" that specializes in Trojan Horses uses the same group of routines for embedding the maliciousness into a plurality of programs. These routines are referred herein as "core routines". Of course, in addition to the core routines, the programmer may also use other routines.

Indicating the Core Routines by Code Analysis

The core routines actually characterize a "family" of Trojans. Thus, according to one embodiment of the invention, an anti-virus company detects at its laboratory the core routines of an executable that was indicated as malicious, and calculates the CRC of its routines. The detection can be carried out by analyzing the code, debugging, tracing the execution, etc.

According to a preferred embodiment of the present invention, indicating if an executable is a Trojan is carried out by calculating the CRC values of its routines, and checking how many CRC values correspond to the CRC values of known core routines of a Trojan Horse family. If, for example, more than a certain percentage of the CRC values of an executable correspond to the CRC values of a certain Trojan family, then the executable may be indicated as malicious.

Indicating the Core Routine by Statistical Analysis

According to another preferred embodiment of the invention, the records of a database that comprise CRC values of the routines of a plurality of executables are divided to two groups: the CRC values of executables that were indicated as malicious (the "malicious group"), and the CRC values of executables that were indicated as harmless (the "harmless group"). Then the CRC values that appear in both the malicious group and the harmless group, are eliminated from the malicious group. This way there is a high certainty that the CRC values that remain in the malicious group belong to the core routines.

Figure 2:
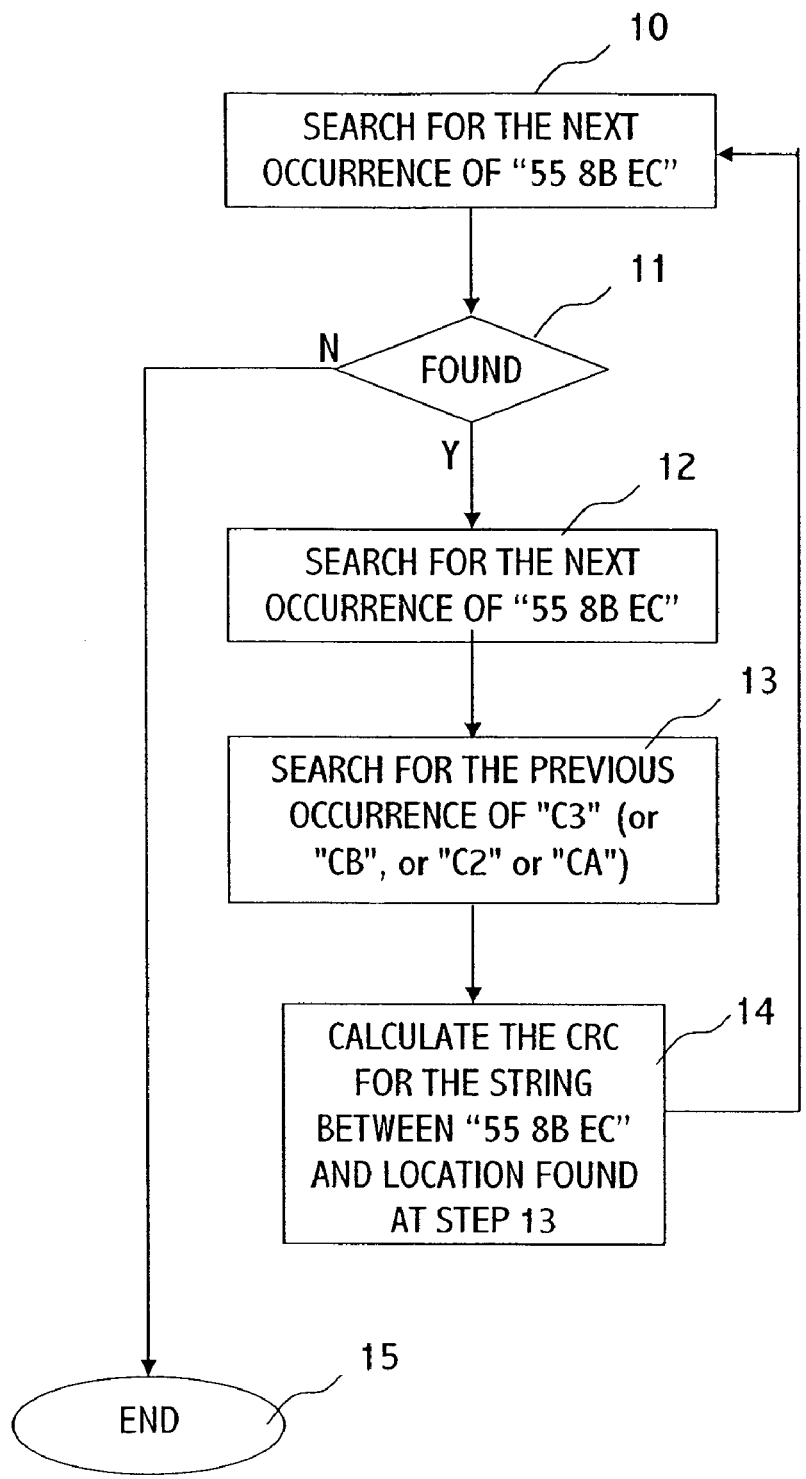
FIG. 2 is a high-level flowchart of a method for calculating the CRC values of the routines of an executable.

FIG. 2 is a high-level flowchart of a method for calculating the CRC values of the routines of an executable. Actually, the executable is a string. It is scanned from its beginning to its end. At FIG. 2 the sequence "55 8B EC" (presented as hexadecimal bytes) determines in the object code of the C language the start of a routine, and the string "C3" (or "CB", or "C2", or "CA") determines the end of a routine.

At step 10, the next occurrence of the string "55 8B EC" is searched. From step 11, if an occurrence of the string "55 8B EC" is found, the flow continues with step 12, otherwise the flow continues with step 15, where the process comes to its end. At step 12, the next occurrence of the string "55 8B EC" is searched, and whether found or not, at step 13 the previous occurrence of "C3" (or "CB", or "C2", or "CA") is searched. If "55 8B EC" is not found, then "C3" (or "CB", or "C2", or "CA") is searched from the end of the file. The routine is the string between "55 8B EC" and "C3" (or "CB", or "C2", or "CA"). After determining what the string of the routine is, the CRC is calculated (step 14) and the flow continues with step 10.

Figure 3A:
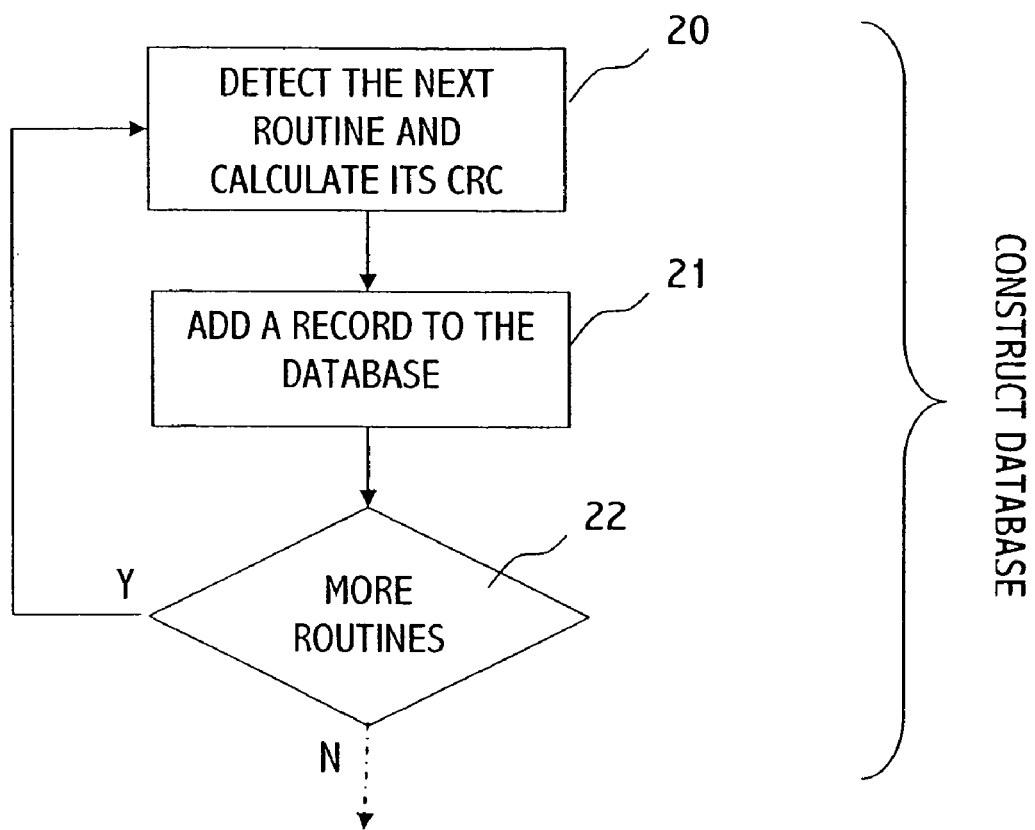
FIGS. 3a and 3b are a high-level flowchart of a method for detecting the presence of malicious code within an executable, according to a preferred embodiment of the invention.
Figure 3B:
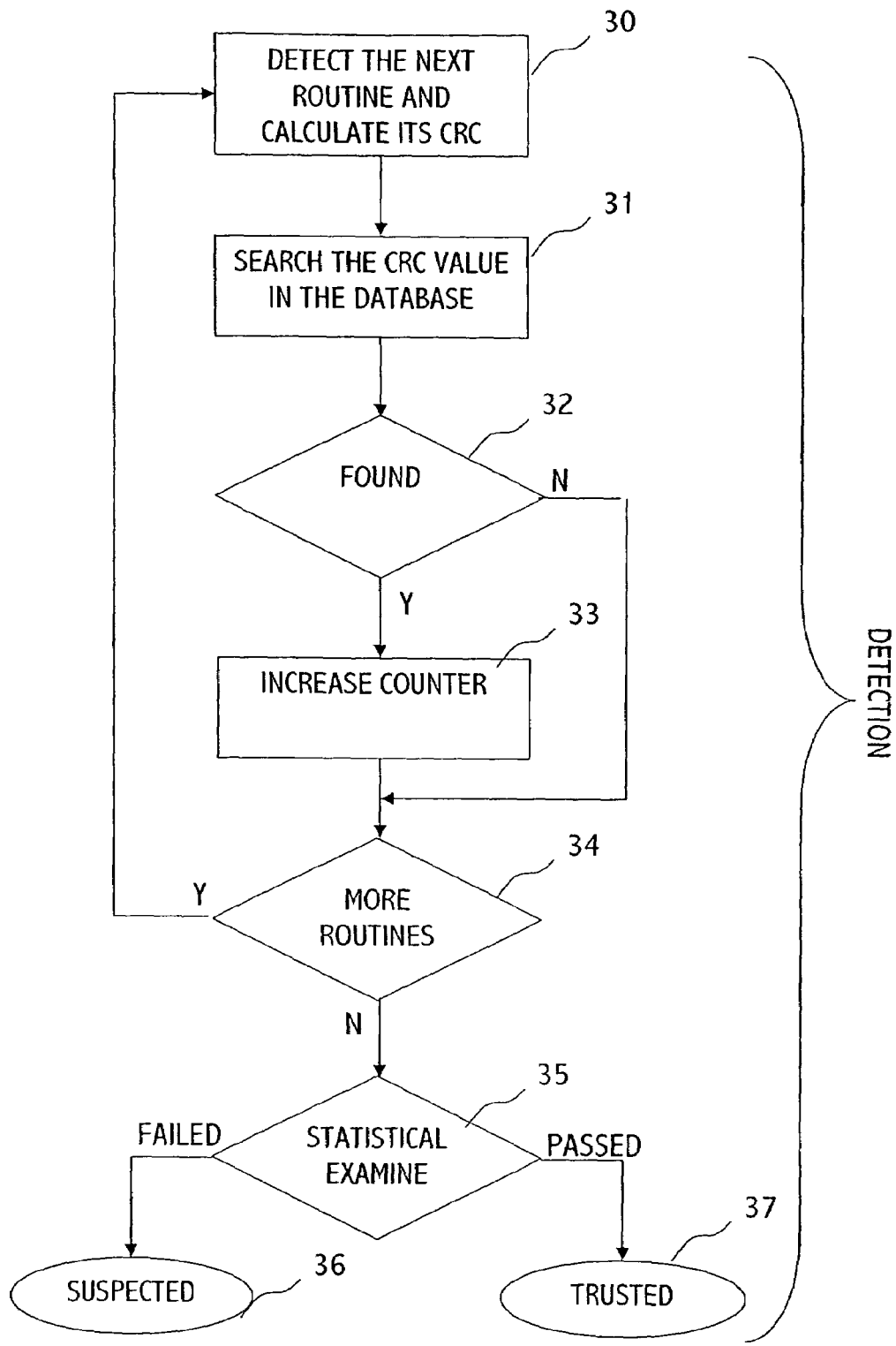

FIGS. 3a and 3b is a high-level flowchart of a method for detecting the presence of malicious code within an executable, according to a preferred embodiment of the invention.

FIG. 3a describes the preliminary stage of the method, in which a database of CRC values is built. Each record of the database corresponds to a routine of a Trojan Horse, thus each record comprises a CRC value and its corresponding executable identification (e.g. the name of the executable and its version). In addition to the CRC value, the routine may comprise additional content such as a flag that determines if it is malicious or not, the programming language of its source code, and so forth.

At step 20, the borders of a routine within an executable are detected (e.g. as described by FIG. 2), and the routine's CRC is calculated. At the next step 21, a record which comprises the CRC, the identification of the executable, is added to the database. From step 22, if more routines are detected, then the flow continues with step 20. This process may continue with additional files.

FIG. 3b describes the detection stage of the method. At step 30, the next routine of the executable is detected, and its CRC is calculated (e.g. in the same manner as described in FIG. 2). Of course, the first time step 30 is carried out, the first routine of the executable is handled. At the next step 31, the calculated CRC value is searched within the database. From step 32, if no corresponding CRC value has been found, then the flow continues with step 34, otherwise with step 33. At step 33, a counter which counts the routines that their corresponding value has been detected is increased by one (of course the value of the counter should be reset when before scanning the executable). From step 33, if more routines are available in the executable, then flow continues with step 30, otherwise with step 35. From step 35, if the value of the counter exceeds beyond a predetermined threshold, than the executable is counted as suspected of comprising a Trojan Horse, otherwise the executable is considered as trusted.

The threshold doesn't necessarily have to be an absolute value, but also a percentage of the total number of the routines found in the executable, an expression that uses different weight for certain CRC values, and so forth. Those skilled in the art will appreciate that the threshold is only an example of statistical analysis and the invention can be implemented by a variety of statistical analyses and/or heuristic methods known in the art.

Those skilled in the art will appreciate that the invention may be implemented by software and/or hardware means. Searching patterns within a string or a file and other operations involved are basically software oriented operations. However, when scanning a huge quantity of files, e.g. at the gateway of an Internet Service Provider, some of the operations may be implemented by hardware means in order to be carried out faster.

Figure 4:
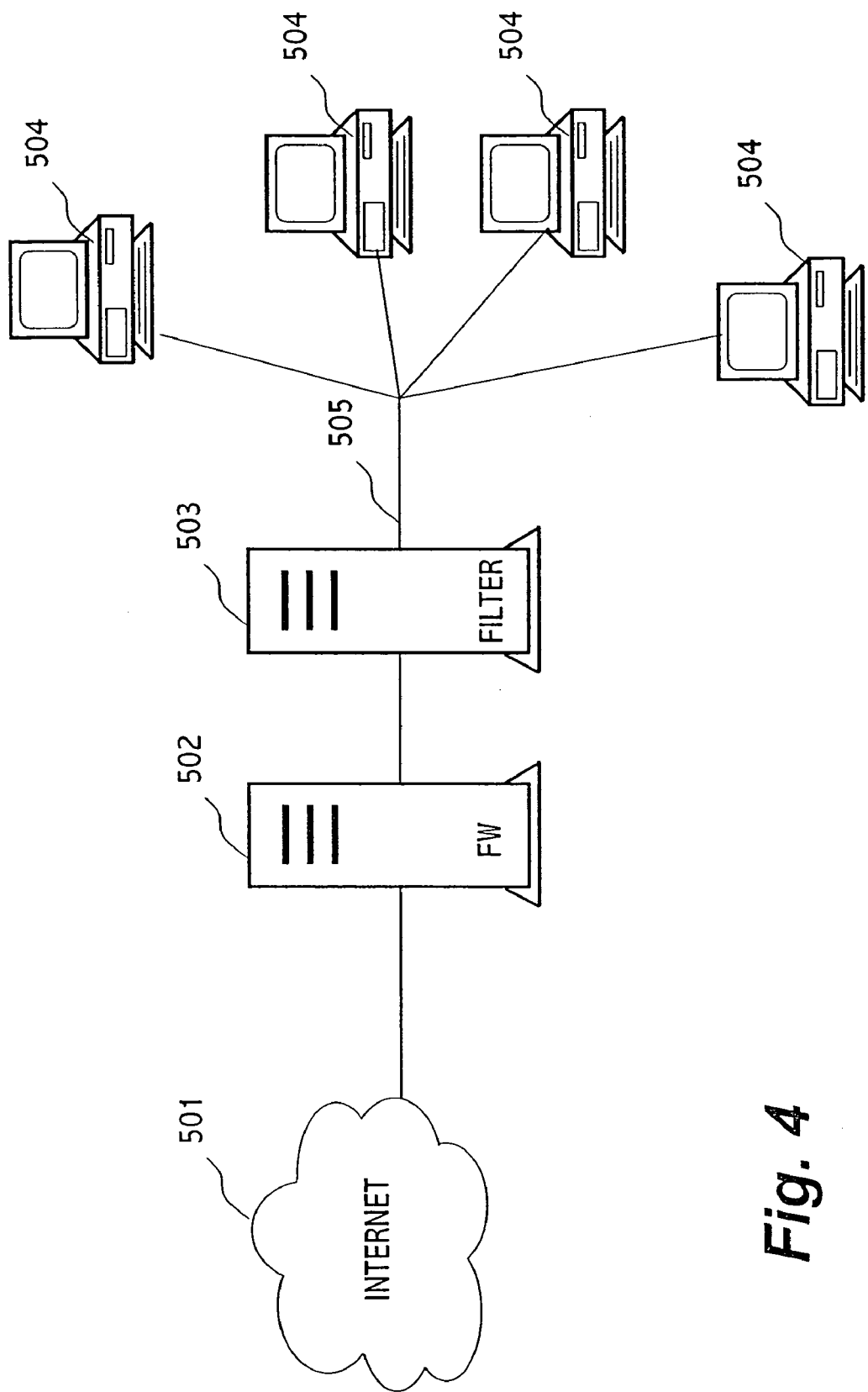
FIG. 4 schematically illustrates a system for indicating an executable as Trojan Horse, according to a preferred embodiment of the invention.

FIG. 4 schematically illustrates a system for indicating an executable as Trojan Horse, according to a preferred embodiment of the invention. The computers 504 are connected to a local network area 505, which is connected to the Internet 501. At the gateway between the local area network 505 and the Internet, two facilities are deployed: the firewall 502 and the filtering facility 503, thus any data received of transferred from/to the local area network 505 can be tested for detecting malicious data. The filtering facility which tests the data is a server (e.g. a dedicated computer) which implements the method for indicating an executable as Trojan Horse, as described herein, along with other methods for detecting maliciousness. The data traffic, especially email and Web pages, is inspected, and whenever an executable is received to the local area network 505 or sent therefrom, it is scanned in the manner described herein, in order to indicate if it is a Trojan Horse.

Alternatively or additionally, the invention may be implemented at the user's machine, by analyzing input and/or output traffic (including mail and mail attachments) between the user's machine and an external network. The invention may also be implemented by scanning the files within the user's machine, in the manner used in the art for this purpose.

As explained herein, according to the present invention, detecting the presence of malicious code within an executable is based on calculating the CRC values of its routines. This is different from other methods used in the art that also implement CRC for detecting maliciousness, since: (a) according to the present invention indicating the maliciousness of an executable is carried out by statistical analysis of the CRC values of the routines, while other CRC-based methods only indicate if the code was corrupted; and (b) the present invention makes use of the CRC values of the routines of an executable, contrary to other CRC-based methods used in the art that test the boot sector of a computer, a portion of an executable, and other, but not the routines of an executable.

It should be noted that in addition to statistical analysis, indicating an executable as Trojan Horse may also be carried out by heuristic analysis.

It should be noted that the present invention can be implemented for both compiled and non-compiled executables, since the compiled executable is a reflection of the non-compiled executable, and therefore the routines of the non-compiled executable are reflected in its compiled executable.

Those skilled in the art will appreciate that the invention can be embodied by other forms and ways, without losing the scope of the invention. The embodiments described herein should be considered as illustrative and not restrictive.

The invention claimed is:

1. A method for indicating an executable as a Trojan Horse, the executable having code and including a plurality of routines, the method comprising:
   executing instructions by one or more computer processors to effect the following:
   (a) gathering in a database information related to a CRC value of at least one routine of at least one known Trojan Horse;
   (b) for each routine of the plurality of routines,
      (i) scanning the code of the executable for respective first and second borders of said each routine;
      (ii) detecting a respective beginning and a respective end of said each routine according to said respective first and second borders;
      (iii) identifying respective code located between said respective beginning and end as code of said each routine; and
      (iv) calculating a respective CRC value of said each identified respective code, thereby calculating a respective CRC value for said each routine; and
   (c) indicating whether the executable is a Trojan Horse according to a correspondence of at least one said calculated CRC value that is calculated from the executable to said information in said database.

2. The method according to claim 1, wherein the code of the executable is compiled code.

3. The method according to claim 1, wherein the code of the executable is non-compiled code.

4. The method according to claim 3, wherein said compiled code includes at least one of:
   a script;
   VBScript;
   a JavaScript;
   ASP; and
   interpreted code.

5. A method according to claim 1, wherein said information is selected from the group consisting of:
   the identification of a Trojan Horse;
   the identification of a Trojan Horse family; and
   at least one CRC value of at least one routine of a Trojan Horse.

6. The method according to claim 1, wherein said correspondence is determined by statistical analysis comprising:
   characterizing at least one Trojan Horse family according to a similarity between a CRC value of at least one routine of at least one known Trojan Horse, wherein said correspondence relates said CRC value of the at least one routine of the executable to a CRC value of at least one routine of said at least one Trojan Horse family.

7. The method according to claim 6, wherein said characterizing at least one Trojan Horse family comprises: detecting a CRC value of at least one routine existing in at least two members of said Trojan Horse family.

8. The method according to claim 6, wherein said statistical analysis is based on said CRC value of the at least one routine of the executable and at least one CRC value of at least one routine of said Trojan Horse family.

9. A system for indicating an executable as a Trojan Horse, the executable including a plurality of routines, each routine of the plurality of routines being associated with a respective first border indicating a respective beginning of said each routine and a respective second border indicating a respective end of said each routine, the system comprising:
   (a) one or more computer processors operative to:
      (i) identify, for said each routine of the plurality of routines within the executable the respective first and second borders; and
      (ii) calculate, for said each routine, a respective CRC value of code located between said respective first and second borders; and
   (b) a database for storing information related to a CRC value of at least one routine of at least one known Trojan Horse;
   wherein said one or more computer processors are further operative to:
      (iii) determine a correspondence between at least one said calculating CRC value for the executable and said information stored in said database; and
      (iv) indicate whether the executable is a Trojan horse according to said correspondence.

10. The system according to claim 9, wherein said determining the correspondence is selected from the group consisting of statistical analysis and heuristic analysis.

11. The system according to claim 9, wherein the system is deployed at a gateway between two networks.

12. The system according to claim 9, wherein the system is deployed at a user's machine.

13. The method of claim 1 wherein step b is carried out by a user machine that is operatively linked to a computer network via a network port, and wherein steps (b) and (c) are carried out in response to at least one of a sending of outgoing traffic and a receiving of incoming traffic via the network port.

14. The method of claim 13 wherein at least one of said incoming and outgoing traffic includes at least one of email and one or more email attachments.

15. The method of claim 1 wherein the method is carried out by a filtering server that:
   i) co-resides in a local area network with a plurality of user computers; and
   ii) is separate from the plurality of computers, and wherein step (b) is carried out in response to at least one of:
   i) a sending of outgoing traffic from one or more computers of the plurality of computers to the internet;
   ii) a receiving of incoming traffic from the Internet into the local area network.

16. The method of claim 1 wherein step b is carried out by a dedicated hardware module.

17. The method of claim 1 wherein, for said each code module, said scanning includes:
   i) searching, within the executable, for an occurrence of a routine-beginning string;
   ii) after step (i), identifying said routine-beginning string as said respective first border of said each code module;
   iii) after step (i), searching, within a portion of the executable that follows said respective first border, for an occurrence of a routine-beginning string;
   iv) after step (iii), for a portion of the executable that:
      A) follows said respective first border;
      B) precedes said routine-beginning string of step (iii);
      C) includes multiple distinct occurrences of routine-ending strings, searching for a last occurrence of a routine-ending string; and
   v) identifying said last occurrence routine-ending string as said respective second border of said each code module.

18. The system of claim 9, wherein said one or more computer processors are operative to:
   i) search, within the executable, for an occurrence of a routine-beginning string;
   ii) after step (i), identify said routine-beginning string as said respective first border of said each code module;
   iii) after step (i), search, within a portion of the executable that follows said respective first border, for an occurrence of a routing-beginning string;
   iv) after step (iii), for a portion of the executable that:
      D) follows said respective first border;
      L) precedes said routine-beginning string of step (iii);
      F) includes multiple distinct occurrences of routine-ending strings, searching for a last occurrence of a routine-ending string; and
   v) identify said last-occurring routine-ending string as said respective second border of said each code module.

19. A computer program product, comprising a computer usable medium having a computer readable program code embodied therein, wherein execution by one or more computer processors of the computer readable program code implements a method of indicating an executable as a Trojan Horse, the executable having code an including a plurality of routines, the method comprising;
   (a) gathering in a database information related to a CRC value of at least one routine of at least one known Trojan Horse;
   (b) for each routine of the plurality of routines,
      (i) scanning the code of the executable for respective first and second borders;
      (ii) detecting a respective beginning and a respective end of said each routine according to said respective first and second borders;
      (iii) identifying respective code located between said respective beginning and end as code of said each routine;
      (iv) calculating a respective CRC value of said identified respective code, thereby calculating a respective CRC value for said each routine; and
   (c) indicating whether the executable is a Trojan Horse according to a correspondence of at least one said calculated CRC value that is calculated from the executable to said information in said database.

* * * * *